United States Patent [19]

Watanabe et al.

[11] Patent Number: 5,104,707
[45] Date of Patent: Apr. 14, 1992

[54] TRANSFER SHEET FOR MAKING PRINTED-WIRING BOARD BY INJECTION MOLDING AND METHOD FOR PRODUCING SAME

[75] Inventors: Akihiko Watanabe; Yuuki Numazaki; Naoto Kanno; Hirokazu Inoguchi, all of Fukushima, Japan

[73] Assignee: Nitto Boseki Co., Ltd., Fukushima, Japan

[21] Appl. No.: 534,716

[22] Filed: Jun. 7, 1990

[30] Foreign Application Priority Data

Jun. 23, 1989 [JP] Japan ................... 1-161383

[51] Int. Cl.$^5$ .............................................. B32B 3/00
[52] U.S. Cl. ...................................... 428/40; 428/209; 428/411.1; 428/413; 428/457; 428/901; 156/233
[58] Field of Search ............... 428/209, 40, 411.1, 428/413, 457, 901; 156/233; 264/104

[56] References Cited

U.S. PATENT DOCUMENTS

| | | | |
|---|---|---|---|
| 4,306,925 | 12/1981 | Lebow et al. | 430/315 |
| 4,357,395 | 11/1982 | Lifshin et al. | 428/914 |
| 4,383,003 | 5/1983 | Lifshin et al. | 204/192.15 |
| 4,455,181 | 6/1984 | Lifshin et al. | 427/419.2 |
| 4,937,278 | 6/1990 | Besso | 524/413 |
| 4,969,257 | 11/1990 | Sato et al. | 427/96 |

*Primary Examiner*—Patrick J. Ryan
*Attorney, Agent, or Firm*—Darby & Darby

[57] ABSTRACT

A transfer sheet for making a printed-wiring board by injection molding which is free from circuit damage during injection molding and has excellent releasability comprises a carrier film, a copper foil circuit, and a releasing layer provided between the carrier film and the copper foil circuit. Preferably, said releasing layer has a T-type peeling strength between the carrier film and the copper foil circuit of 0.025-0.25 kg/25 mm. A method for producing such transfer sheet comprises coating a releasing layer on a carrier film, then contact-bonding a copper foil thereto with heat, pattern-printing an etching resist on the resulting laminate film, and subjecting it to etching to form a copper foil circuit.

22 Claims, No Drawings

TRANSFER SHEET FOR MAKING PRINTED-WIRING BOARD BY INJECTION MOLDING AND METHOD FOR PRODUCING SAME

BACKGROUND OF THE INVENTION

1. Field of the Invention

The present invention relates to an apparatus and process for making a transfer sheet used in an injection molded printed-wiring board that is produced by a transfer method.

2. Related Art

A process for obtaining injection molded printed-wiring boards by a transfer method, is know in the art which uses a transfer sheet comprising laminated circuit units formed by laminate-printing using electroconductive and insulating pastes [Japanese Patent Kokai (Laid-Open) No. 63-219189]. A process using transfer sheet in which are provided a peeling layer comprising a material corroded with a solvent for electroconductive ink, a protective layer and printed circuit comprising an electroconductive ink is also known [Japanese Patent Kokai (Laid-Open) No. 63-257293]. Furthermore, also known is a process which uses the vapor deposition method, comprising a method of obtaining a metallic pattern printed board by providing a metallic film on an electroconductive primary film by plating, forming a pattern with a masking material, then further depositing a metallic film thereto to obtain a metallic pattern and then etching it [Japanese Patent Kokai (Laid-Open) No. 63-274194].

However, these transfer sheets suffer from various problems because either an electroconductive paste or a metallic conductor obtained by vapor deposition is used as a circuit conductor. When electroconductive paste is used, a circuit can be conveniently made by printing and drying, but it has a higher conductor resistance than metallic copper and the resulting circuit is unreliable. Furthermore, in the case of obtaining a copper circuit by vapor deposition, although the conductor resistance has no problems, it is difficult to obtain the conductor thickness necessary for printed-wiring boards. Furthermore, the resulting metal surface is flat, preventing the anchoring effect from being exhibited when adhering a substrate thereto and resulting in inferior adhesion to the substrate. A further problem is a very high cost. On the other hand, the copper foil generally used for printed-wiring boards has a high electrical reliability and results in a reliable circuit and has a roughened surface such that sufficient adhesion can be expected. However, in order to make a transfer sheet using this copper foil, it is necessary to laminate a carrier film and copper foil to each other with a suitable adhesive to form a laminate sheet.

The above adhesive is required to have an adhesive activity high enough to inhibit damage such as shifting or peeling of the circuit which may occur during production of the circuit pattern or injection molding and releasing power for easy peeling of the carrier film after molding which are contrary to each other in nature.

It is very difficult for general adhesives to have both of these properties. A sufficient solution has not yet been made in this respect.

SUMMARY OF THE INVENTION

The present invention is a result of intensive research conducted by the inventors in an attempt to solve the above problems and obtain a transfer sheet of high reliability.

That is, it has been found that, a transfer sheet free from circuit damaged which may occur during injection molding and having excellent carrier film releasability can be obtained when the adhesion strength for separating the laminated carrier film and copper foil by pulling their ends in the direction of 180° to each other (hereinafter referred to as "T-type peeling strength") is adjusted to 0.025–0.25 kg/25 mm, when measured in accordance with JIS K6854.

DETAILED DESCRIPTION OF PREFERRED EMBODIMENT

Adjustment of the strength for peeling the contact-bonded carrier film and copper foil to the above range can be attained by providing a specific releasing layer between the carrier film and the copper foil. In order to adjust the T-type peeling strength to the above range by using the releasing layer, adhesion and releasability must be balanced.

When substrate resins having low molding temperature such as ABS are used, adhesives mainly composed of polyvinyl formal resin having a relatively high heat resistance may be used as the releasing layer. However, by use of such adhesive alone, it is difficult to obtain releasability, of the substrate or copper foil after molding, and the adhesive must be combined with releasability imparting agent such as silicone.

Resins which are molded at higher than 300° C., such as polycarbonate resins (PC) or polyether imides (PEI), polyether sulfone (PES), and polyphenylene sulfide (PPS), are called super engineering plastics. Use of a combination of polyvinyl formal resin and silicone causes damage to the circuit due to softening and flowing of the releasing layer. Therefore, when the super engineering plastics are used as substrate resins, a mixture of an epoxy resin, a hardener, and an adhesive may be used as releasing layer.

The polyvinyl formal resins used as releasing layer for resins of low molding temperature, such as ABS, include those which have an average polymerization degree of about 200 or more, preferably about 400°–450°. These resins are dissolved in an amount of about 5–20 (wt/wt)% in a solvent such as chloroform and are then coated. If the average polymerization degree is less than 200, heat resistance decreases and the releasing layer may be softened during injection molding to cause damage to the circuit. In order to improve heat resistance of polyvinyl formal resin, resins such as isocyanate resin, melamine resin, phenolic resin or resins having equivalent properties may be added.

The coating amount of the releasing layer (solid content excluding solvent, which will be applied to the coating amounts referred to hereinafter) is usually 1–30 g/m$^2$, preferably 5–15 g/m$^2$. If the coating amount is less than 1 g/m$^2$, the lamination of the carrier film and copper foil cannot be satisfactorily performed and problems may occur such as bubble formation.

As the releasability imparting agent, there may be used various silicone releasing agents and/or acrylic oligomers.

The silicone releasing agents include dimethyl silicone oil and α-methylstyrene-, α-olefin-, poly- ether-, epoxy-, or carboxyl-modified silicone oils which are generally used as releasing agents. With reference to the amount of the silicone releasing agent, a solution of the releasing agent at a concentration of 0.01–0.5% (wt/wt), preferably 0.05–0.2% (wt/wt) in a solvent such as toluene, chloroform, or MEK is coated on a polyvinyl formal resin or on copper foil in an amount of 5–15 g/m². Alternatively, the releasing agent may be previously blended with polyvinyl formal resin.

As the acrylic oligomers, there may be suitably used butyl acrylate oligomers having a molecular weight of 3000–10000atomic mass units. For example, toluene, chloroform, or MEK may be used as solvent. A solution of the oligomers at a concentration of 0.0001–0.01% (wt/wt) may be coated in an amount of 5–15 g/m², as in the case of silicone.

In the case of using a substrate resin necessary to be molded at high temperature, a mixture of an epoxy resin, hardener, and an adhesive is used as the releasing layer. The epoxy resin includes, for example, bisphenol-type epoxy resins, novolak-type epoxy resins, and alicyclic epoxy resins. Especially preferred are bisphenol-type epoxy resins.

As hardeners for the epoxy resin, aliphatic amines such as ethylenediamine, diethylenetriamine, triethylenetetramine, and hexamethylenediamine, imidazoles such as 2-methylimidazole, 2-ethylimidazole, and 2-ethyl-4-methylimidazole and aromatic amines such as m-phenylenediamine, diaminodiphenylmethane and diaminodiphenylsulfone may be used. Aliphatic amines and imidazoles are preferred due to their hardenability.

Adhesives which may be used include thermoplastic resins such as thermoplastic polyester resins, polyvinyl formal resins, polyvinyl butyral resins, and EVA (ethylene-vinyl acetate copolymers). Especially preferred are polyvinyl formal resins which are the same as those referred to hereinabove. In use, 100 parts by weight of epoxy resin, a usual amount of hardener, and 1–10 parts by weight, preferably 2–5 parts by weight of thermoplastic resin are blended. The resulting blend is coated in an amount of 1–30 g/m², preferably 5–15 g/m².

That is, in the case of an "epoxy releasing layer", the desired T-type peeling strength, which is a balanced power between adhesion and releasability, can be obtained by adding a small amount of an adhesive to an epoxy resin and by adjusting the hardening degree of the epoxy resin an additional amount of the adhesive.

The transfer sheet for making an injection molded printed-wiring board and process for producing it according to the present invention is explained below.

First, a copper foil is laminated by a heat pressure roll onto a carrier film on which a releasing layer has been formed by drying, or hardening and drying, the above-mentioned materials. Thus, a releasing layer is formed which is adjusted to provide a T-type peeling strength of 0.025–0.25 kg/25 mm, preferably 0.04–0.10 kg/25 mm. Metallic conductors include electrolytic copper foil for printed-wiring boards, rolled copper foil, aluminum foil for shielding, and other metallic foils and may be optionally selected according to the objects. An electrolytic copper foil having a roughened surface is preferable. Examples of carrier films are polyester (PET) film and polyimide (PI) film. When the electrolytic copper foil is used, the roughened surface should be the front surface. Then, onto the copper foil of the resulting laminate sheet is provided an etching resist by a printing, photographic, or other method known in the art and the circuit is formed by a conventional subtractive process.

The thus obtained transfer sheet is high in releasing layer heat resistance, can retain the circuit even if resin flows during injection molding, is excellent in carrier film releasability at peeling and shows stable transfer moldability.

The process for making an injection molded printed-wiring board using this transfer sheet is explained below.

An adhesive is coated on the above transfer sheet on which a copper foil circuit has been formed and is dried to form an adhesive layer. The adhesive can be suitably chosen depending on the kind of substrate resin used.

The transfer sheet is placed in a cavity of an injection mold comprising a stationary platen side and a moving platen side so that the carrier film is on the front surface side of molded product and the mold is clamped. Then, substrate resin is injected into the cavity and simultaneously with formation of a molded product, the circuit on the transfer sheet is transferred onto the surface of the molded product. After cooling, the molded product is taken out from the mold and the carrier film and the releasing layer of the transfer sheet are peeled from the molded product to obtain an injection molded product having a circuit conductor.

As the substrate resin, general-purpose resins may be used which are generally used for electric insulation, such as ABS resin, polycarbonate (PC), and polybutyl terephthalate (PBT). Super engineering plastics such as polyether sulfone (PES) and polyether imide (PEI) are preferred for uses which require heat resistance.

For some uses, fillers such as glass fiber may be incorporated into the substrate resin.

It is considered that circuit damage is caused by poor interfacial adhesion between the releasing layer and the copper foil, and low heat resistance on the releasing layer. Influence of the heat resistance of releasing layer is that the releasing layer of the transfer sheet placed in a mold is heated by the mold or injected resin and is molten and softened and cannot resist the flowing pressure of the resin injected, resulting in shifting or breaking of the circuit.

Furthermore, referring to the releasability after injection molding, if the interfacial adhesion is too strong, film breaking or releasing-layer retention (retention of the releasing layer on the molded product side) occurs, causing product failures.

These problems have been solved by improving the heat resistance and adjusting the adhesion to proper level according to the present invention.

The present invention is explained by the following examples.

EXAMPLE 1

A PET film of 50 μm thick as a carrier film was coated with a chloroform solution containing 10% by weight of DENKAFORMAL #20 (commercially available polyvinyl formal resin manufactured by Denki Kagaku Kogyo Co.) in an amount of 10 μg/m² (solid content). Furthermore, in order to obtain releasability from copper foil, epoxy-modified silicone KF-103 (manufactured by Shinetsu Chemical Co., Ltd.) was coated on an electrolytic copper foil of 35 Pm thick in an amount of 10 g/m² with the silicone concentration being 0.1%.

After drying, the carrier film and the copper foil were heat laminated at 160° C. by a heating pressure roll. The speed of the pressure roll was 1 m/min and the pressure was 1 kg/cm².

Then, a pattern was formed with etching resist by screen printing, and the etched with ferric chloride solution to obtain a transfer sheet having a copper foil circuit. This transfer sheet was placed in an injection mold. A molded product having a circuit on the surface was obtained by conventional methods using ABS resin as a substrate resin.

EXAMPLE 2

A transfer sheet and molded product were obtained in the same manner as in Example 1 except that a chloroform solution containing 0.001% by weight of MACROMONOMER CB-6 (manufactured by Toagosei Chemical Industry Co., Ltd.) as an acrylic oligomer was used in place of the epoxy-modified silicone KF-103 as a releasability imparting agent.

COMPARATIVE EXAMPLE 1

The transfer sheet and molded product were obtained in the same manner as in Example 1 except that the concentration of silicone KF-103 was 0.005%.

COMPARATIVE EXAMPLE 2

The transfer sheet and molded product were obtained in the same manner as in Example 1 except that concentration of silicone KF-103 was 0.8%.

The transfer sheets and molded products obtained in the above Examples 1 and 2 and Comparative Examples 1 and 2 were evaluated and the results are shown in Table 1 which compares T-type peeling strength between carrier film and copper foil, circuit damage and releasability.

T-type peeling strength was measured according to JIS K-6854 using a tensile strength tester (AUTOGRAPH manufactured by Shimadzu Seisakusho Ltd.).

Circuit damage was judged by visual evaluation of shifting or breaking of the circuit transferred to molded product.

Releasability was evaluated on the occurrence of either breakage of carrier film or releasing-layer retention (on molded product) when the carrier film was peeled from the molded product obtained by the injection molding.

TABLE 1

|  | T-type peeling strength kg/25 mm | Damage of circuit | Releasability |
| --- | --- | --- | --- |
| Example 1 | 0.075 | ○ | ○ |
| Example 2 | 0.063 | ○ | ○ |
| Comparative Example 1 | 0.300 | ○ | x |
| Comparative Example 2 | 0.020 | x | ○ |

Note:
"○" in the above Table 1 means that there are no practical problems in damage of circuit and releasability.
"x" means are practical problems exist and the product cannot be used.

EXAMPLE 3

A transfer sheet was prepared in the same manner as in Example 1 except that ARALDITE CY-232 (manufactured by Ciba Geigy Co.) as epoxy resin, aliphatic amine-type hardener HY-956 (manufactured by Ciba Geigy Co.) as a hardener and DENKAFORMAL #20 as an adhesive were used at a weight ratio of 100:30:3 in place of materials used as the releasing agent in Example 1; the coating amount (solid content) was 10 g/m$^2$; hardening and drying were carried out at 160° C. for 1 minute; and heat lamination conditions were: temperature 200° C. roller speed 1 m/min; and roller pressure 1 kg/m$^2$.

The transfer sheet was subjected to injection molding by a conventional method using polycarbonate (PC) in place of ABS resin used in Example 1 to obtain a molded product having a circuit.

EXAMPLES 4, 5, and 6

A transfer sheet and molded product were obtained in the same manner as in Example 3 except that thermoplastic polyester resin VYLON-200 (manufactured by Toyobo Co., Ltd.) was used as a adhesive. Separately, molded products were obtained in the same manner as above except that PES and PEI were used as a substrate resin (Examples 5 and 6). Results of the evaluation of these transfer sheets and molded products are shown in Table 2.

COMPARATIVE EXAMPLE 3

A transfer sheet and molded product were obtained in the same manner as in Example 3 except that the weight ratio of the releasing layer material was 100:30:15.

COMPARATIVE EXAMPLE 4

A transfer sheet and molded product were obtained in the same manner as in Example 3 except that the weight ratio of the releasing layer material was 100:30:0 and the hardening and drying conditions were 160° C. and 5 minutes. These were evaluated in the same manner as above and the results are shown in Table 2 in accordance with the same criteria as in Table 1.

TABLE 2

|  | Substrate | T-type peeling strength kg/25 mm | Damage of circuit | Releasability |
| --- | --- | --- | --- | --- |
| Example 3 | PC | 0.075 | ○ | ○ |
| Example 4 | PC | 0.100 | ○ | ○ |
| Example 5 | PES | 0.100 | ○ | ○ |
| Example 6 | PEI | 0.100 | ○ | ○ |
| Comparative Example 3 | PC | 0.275 | x | x |
| Comparative Example 4 | PC | 0.013 | x | ○ |

Results of the evaluation on circuit damage and releasability in Comparative Example 3 are both "X" in Table 2. This is because the ratio of the thermoplastic resin to the epoxy resin was high and hence adhesion increased to cause deterioration in releasability and furthermore, heat resistance decreased to readily cause damage to the circuit.

As explained above, the molded product obtained according to the present invention is high in circuit reliability and can be used for housings or connectors of various electronic equipment. According to the method of the present invention, conductor circuits in which copper foil of high electric reliability is used in molded products can be easily produced and so such effects as sharp reduction in use of a rigid or flexible printed-wiring board employed at present and simplification of setting up of parts and saving of space can be expected and the present invention makes a great contribution to miniaturization and weight saving of electronic equipment and cost reduction.

What is claimed is:

1. A transfer sheet useful for making a printed-wiring board by injection molding, comprising:

a carrier film;
a copper foil circuit; and
a releasing layer provided between the carrier film and the copper foil circuit, the releasing layer having a T-type peeling strength between 0.025–0.25 kg/25 mm, inclusive.

2. A transfer sheet useful for making a printed-wiring board by injection molding, comprising:
a carrier film;
a copper foil circuit; and
a releasing layer provided between the carrier film and the copper foil circuit, the releasing layer having ingredients including a polyvinyl formal resin and a releasability imparting agent.

3. The transfer sheet according to claim 2, wherein the releasing layer has a T-type peeling strength between the carrier film and the copper foil circuit within a range of 0.025–0.25 kg/25 mm., inclusive.

4. The transfer sheet of claim 2, wherein the releasing layer, exclusive of solvent, is provided in an amount within a range of 1–30 g/m$^2$.

5. The transfer sheet of claim 2, wherein the releasability imparting agent is selected from a group consisting of a silicon releasing agent and an acrylic oligomer.

6. The transfer sheet of claim 5, wherein the silicon releasing agent is chosen from a group consisting of: dimethyl silicon oil, $\alpha$-methylstyrene-modified silicon oil, $\alpha$-olefin-modified silicon oil, poly-modified silicon oil, ether-modified silicon oil, epoxy-modified silicon oil, and carboxyl-modified silicon oil.

7. The transfer sheet of claim 5, wherein the acrylic oligomer is a butyl acrylate oligomer having a molecular weight between 3,000–10,000 atomic mass units.

8. A transfer sheet useful for making a printed-wiring board by injection molding, comprising:
a carrier film;
a copper foil circuit; and
a releasing layer provided between the carrier film and the copper foil circuit, the releasing layer having ingredients including an epoxy resin, an epoxy resin hardener, and an adhesive.

9. The transfer sheet of claim 8, wherein the releasing layer has a T-type peeling strength between the carrier film and the copper foil circuit is 0.025–0.025 kg/25 mm., inclusive.

10. The transfer sheet of claim 8, wherein the releasing layer, exclusive of solvent, is provided in an amount between a range of 1–30 g/m$^2$.

11. The transfer sheet of claim 8, wherein the epoxy resin is selected from a group consisting of bisphenol-type epoxy resins, novolak-type epoxy resins, and alicyclic epoxy resins.

12. The transfer sheet of claim 8, wherein the epoxy resin hardener is selected from a group consisting of aliphatic amines, imidazoles, and aromatic amines.

13. The transfer sheet of claim 12, wherein the aliphatic amine is selected from the group consisting of ethylenediamine, diethylenetriamine, triethylenetetramine, and hexamethylenetiamine.

14. The transfer sheet of claim 12, wherein the imidazole is selected from a group consisting of 2-methylimidazole, 2-ethylimidazole, and 2-ethyl-4-methylimidazole.

15. The transfer sheet of claim 12, wherein the aromatic amine is selected from a group consisting of m-phenylenediamine, diaminodiphenylmethane, and diaminodiphenylsulfone.

16. The transfer sheet of claim 8, wherein the adhesive is a thermoplastic resin.

17. The transfer sheet of claim 16, wherein the thermoplastic resin is selected from a group consisting of thermoplastic polyester resins, polyvinyl formal resins, polyvinyl butyral resins, and ethylene-vinyl acetate copolymers.

18. A method for producing a transfer sheet for making an injection molded product, comprising the steps of:
coating a carrier film with a resin composition to form a releasing layer;
contact-bonding a copper foil to the film with heat to produce a resulting bonded film;
pattern-printing an etching resist on the resulting bonded film; and
etching the bonded film over the etching resist to form a copper foil circuit having a pattern as defined by the etching resist.

19. The transfer sheet of claim 18, wherein the coating step includes coating the carrier film with a resin composition comprising a polyvinyl formal resin and a releasing agent selected from a group consisting of an acrylic oligomer and a silicon releasing agent.

20. The method of claim 19, wherein the contact-bonding step is performed at a temperature lower than 300°.

21. The method of claim 18 wherein the coating step includes coating the carrier film with a resin composition comprising an epoxy resin, an epoxy hardener, and a thermoplastic resin adhesive.

22. The method of claim 19, wherein the contact bonding step is performed at a temperature equal or greater to 300° C.

* * * * *